United States Patent
Koyama et al.

(10) Patent No.: US 7,924,107 B2
(45) Date of Patent: Apr. 12, 2011

(54) RESONANT TUNNELING STRUCTURE

(75) Inventors: Yasushi Koyama, Yokohama (JP); Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 266 days.

(21) Appl. No.: 12/257,214

(22) Filed: Oct. 23, 2008

(65) Prior Publication Data

US 2010/0026400 A1 Feb. 4, 2010

(30) Foreign Application Priority Data

Nov. 29, 2007 (JP) ................................ 2007-308969

(51) Int. Cl.
*H03B 5/12* (2006.01)
(52) U.S. Cl. ................ 331/107 T; 331/107 DP; 257/17; 257/20; 257/25; 438/22
(58) Field of Classification Search ............ 331/107 DP, 331/107 T; 257/17, 20, 25, 427; 438/22
See application file for complete search history.

(56) References Cited

U.S. PATENT DOCUMENTS

| | | | |
|---|---|---|---|
| 5,400,087 A | 3/1995 | Uramoto et al. | |
| 6,133,593 A | 10/2000 | Boos et al. | 257/194 |
| 7,386,024 B2 | 6/2008 | Sekiguchi et al. | |
| 7,463,104 B2 | 12/2008 | Sekiguchi et al. | |
| 2006/0214176 A1 | 9/2006 | Ouchi et al. | |
| 2007/0215808 A1 | 9/2007 | Sekiguchi et al. | |
| 2008/0048792 A1 | 2/2008 | Ouchi et al. | |

FOREIGN PATENT DOCUMENTS

| | | |
|---|---|---|
| EP | 0322718 | 7/1989 |
| JP | 6030399 | 4/1994 |
| JP | 2007124250 | 5/2007 |

OTHER PUBLICATIONS

Brown, et al., "Oscillations up to 420 GHz in GaAs/AlAs resonant tunneling diodes", Appl. Phys. Lett., vol. 55, No. 17, Oct. 23, 1989, pp. 1777-1779.
U.S. Appl. No. 12/196,224, filed Aug. 21, 2008, Kajiki, et al.
U.S. Appl. No. 12/091,393, International filing date Dec. 20, 2007, Sekiguchi, et al.
Suhara, M., et al., "Characterization of Argon Fast Atom Beam Source and Application to Mesa Etching Process for GaInP/GaAs Triple-Barrier Resonant Tunneling Diodes", Japanese Journal of Applied Physics, Jun. 20, 2006, pp. 5504-5508, vol. 45, No. 6B.
Tewordt, M., et al., "Resonant tunneling in coupled quantom dots", Applied Physics Letters, Feb. 3, 1992, pp. 595-597, vol. 60, No. 5.
Wirner, C., et al., "Phonon bottleneck effects in an InGaAs/InAlAs triple barrier tunnelling diode at high magnetic fields", Semicond. Sci. Technol., May 29, 1997, pp. 998-1002, vol. 12.

(Continued)

*Primary Examiner* — Arnold Kinkead
(74) *Attorney, Agent, or Firm* — Fitzpatrick, Cella, Harper & Scinto

(57) ABSTRACT

A resonant tunneling structure for generating oscillation with multiple fundamental oscillation frequencies is provided. A first quantum well layer has a second sub-band ($E_2$). A second quantum well layer has a first sub-band ($E_1$) and a third sub-band ($E_3$). When no electric field is applied, the resonant tunneling structure satisfies "$(E_{b1}, E_{b2}) < E_1 < E_2 < E_3$", where band edge energies of a first and second electrical contact layers relative to a carrier are expressed by $E_{b1}$ and $E_{b2}$, respectively. When a first electric field ($V_a$) is applied, a resonant tunneling phenomenon is caused by the third sub-band and the second sub-band. When a second electric field ($V_b$) different in polarity from the first electric field is applied, a resonant tunneling phenomenon is caused by the second sub-band and the first sub-band.

15 Claims, 9 Drawing Sheets

OTHER PUBLICATIONS

European Search Report dated Mar. 16, 2009 in European Application No. 08168280.9-1235.

Mizuta, et al., "A New Triple-Well Resonant Tunneling Diode with Controllable Double-Negative Resistance", IEEE Transactions On Electron Devices, vol. 35, No. 11, Nov. 1988, pp. 1951-1956.

Asaoka et al., "Fabrication and characterization of GaInP/GaAs triple barrier resonant tunneling diodes grown by MOCVD", Applied Surface Science 216 (2003).

Chinese Office Action dated Dec. 31, 2010 in corresponding Chinese Application No. 200810179719.0, and English language translation thereof.

FIG. 2A

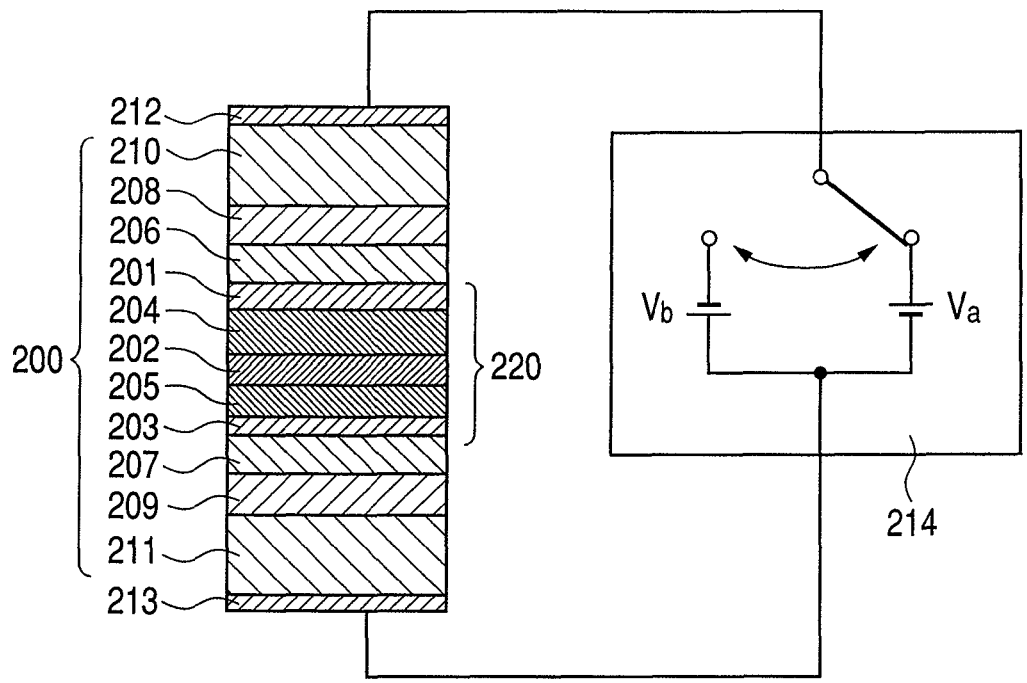

FIG. 2B

| LAYER | MATERIAL | THICKNESS | DOPANT CONCENTRATION |
|---|---|---|---|
| 1st CONTACT LAYER 210 | n++InGaAs | 30nm | $1e+19 cm^{-3}$ |
| 1st ELECTRICAL CONTACT LAYER 208 | n+InGaAs | 50nm | $2e+18 cm^{-3}$ |
| 1st SPACER LAYER 206 | InGaAs | 5nm | |
| 1st BARRIER LAYER 201 | AlAs | 1.3nm | |
| 1st QUANTUM WELL LAYER 204 | InGaAs | 7.6nm | |
| 2nd BARRIER LAYER 202 | InAlAs | 2.6nm | |
| 2nd QUANTUM WELL LAYER 205 | InGaAs | 5.6nm | |
| 3rd BARRIER LAYER 203 | AlAs | 1.3nm | |
| 2nd SPACER LAYER 207 | InGaAs | 5nm | |
| 2nd ELECTRICAL CONTACT LAYER 209 | n+InGaAs | 50nm | $2e+18 cm^{-3}$ |
| 2nd CONTACT LAYER 211 | n++InGaAs | 30nm | $1e+19 cm^{-3}$ |

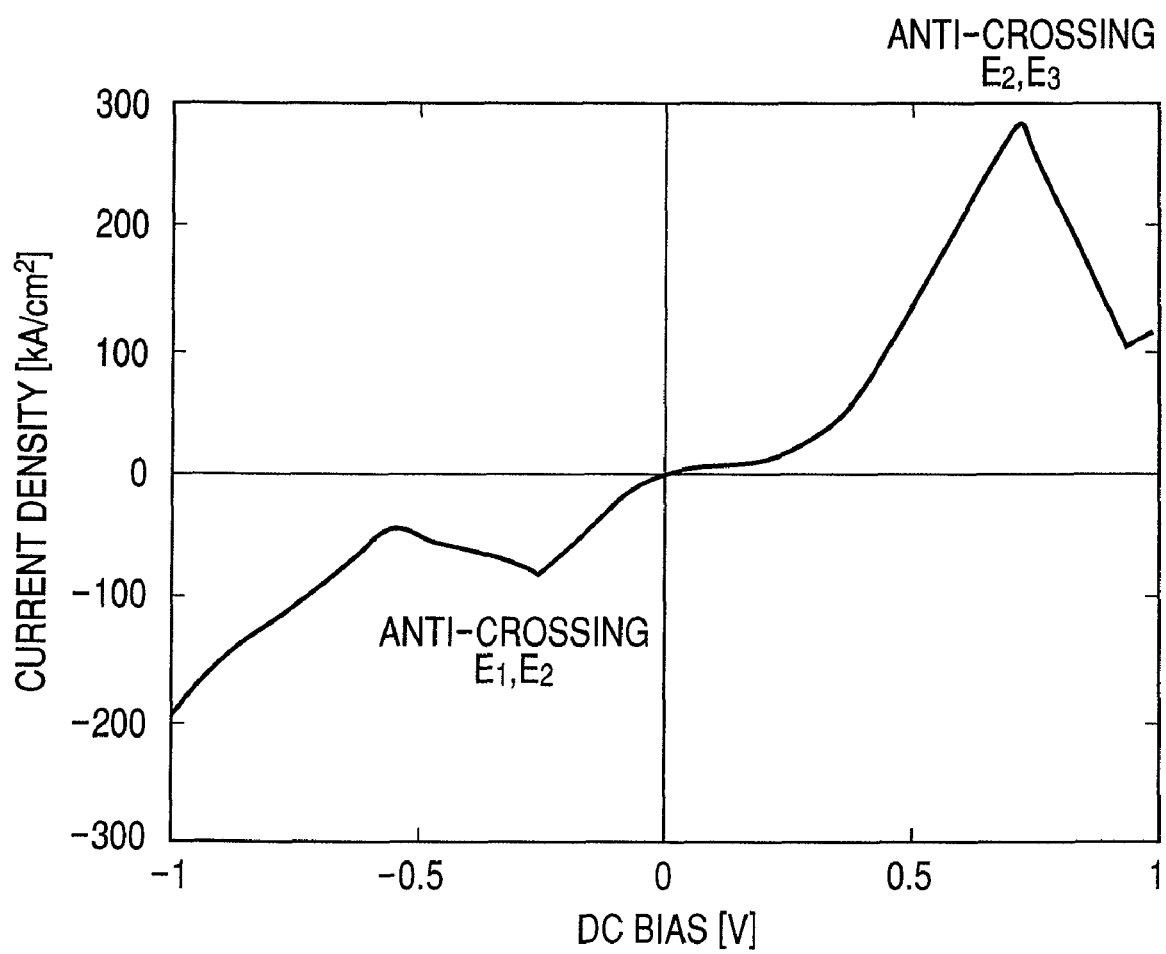

RESONANT TUNNELING STRUCTURE

BACKGROUND OF THE INVENTION

1. Field of the Invention

The present invention relates to a resonant tunneling structure.

2. Description of the Related Art

In recent years, research and development for applying a terahertz-wave (an electromagnetic wave having a frequency of 30 GHz to 30 THz in the present specification) to industrial fields including communications, securities, and medical cares have been actively conducted. The terahertz-wave has substance penetrability and rectilinear propagation characteristics, and hence internal information on an object can be obtained at high resolution based on a reflection signal or a transmission signal from the object. Therefore, various nondestructive or noninvasive inspection technologies have been developed as described below.

(1) Technology using safe fluoroscopic imaging of an object in place of X-ray imaging (2) Spectral technology for obtaining absorption spectrum or complex dielectric constant of a substance to examine binding state of molecules (3) Technology of evaluating carrier concentration or mobility of a superconducting material (4) Technology of analyzing a biomolecule (DNA or protein)

One of the essential development elements to put the technologies described above to practical use is a development of a terahertz light source. Up to now, generating methods using a laser device such as a femtosecond-laser-excitation photoconductive device or a terahertz-wave parametric oscillator with a nonlinear optical crystal have been developed. Generating methods using a small electron vacuum tube such as a backward wave oscillator (BWO) or a gyrotron or using a large electron beam accelerator such as a free-electron laser have been also developed. Because of variable frequency and a large output power, the methods are highly effective in special uses including the identification of fingerprint spectrums of various materials. However, the methods require a large excitation light source or vacuum tube, and hence there is a limit on reductions in size and power consumption of the device.

Therefore, for example, a structure using a quantum cascade laser or a resonant tunneling diode (hereinafter, referred to as RTD) has been studied for current injection type oscillation devices which operate in a terahertz wave region. The oscillation devices are used to realize electromagnetic wave oscillation based on intersubband transition of electrons in a semiconductor quantum well structure.

An RTD type oscillation device as described in Japanese Patent Application Laid-Open No. 2007-124250 is expected to operate in the vicinity of 1 THz at room temperature.

According to Japanese Patent Application Laid-Open No. 2007-124250, a device using a double-barrier RTD as an active layer is provided. In voltage-current (V-I) characteristics of the device as illustrated in FIG. 10, a negative differential resistance 1001 is observed. The double-barrier RTD includes an InGaAs quantum well layer and an AlAs tunnel barrier layer which are epitaxially grown on an InP substrate. When the double-barrier RTD is incorporated as the active layer into a resonator having an antenna structure two-dimensionally formed on the surface of the substrate, an electromagnetic wave 1002 can be oscillated in the vicinity of the region of the negative differential resistance 1001 as illustrated in FIG. 10.

When the device using the double-barrier RTD as the active layer is provided, an oscillation frequency and an oscillation output are limited by a gain resulting from the negative differential resistance 1001 or by an injectable current density.

In view of the oscillation output, it is desirable to increase a peak-to-valley ratio which is a ratio between a peak current value in the voltage-current (V-I) characteristics and a gradient in the negative differential resistance region.

According to Japanese Patent Publication No. H06-030399, in order to increase the peak-to-valley ratio of the RTD, a triple-barrier RTD is proposed which includes a quantum well layer of $In_{0.07}Ga_{0.93}As$, a quantum well layer of GaAs, and a tunnel barrier layer of AlAs, which are epitaxially grown on a GaAs substrate. The two quantum well layers have two mutually different compositions. The triple-barrier RTD includes the quantum well layers described above, and hence a peak current can be generated by a resonant tunneling phenomenon occurring when a voltage is applied. Therefore, the increase in peak-to-valley ratio is realized.

With respect to the frequency of the RTD type oscillation device, it is desired that a single device has multiple (for example, two) frequencies. However, when the structure disclosed in Japanese Patent Application Laid-Open No. 2007-124250 or Japanese Patent Publication No. H06-030399 is used, only a single frequency oscillation can be realized.

SUMMARY OF THE INVENTION

An object of the present invention is to provide a resonant tunneling structure for generating oscillation of multiple fundamental oscillation frequencies.

A resonant tunneling structure according to the present invention comprises; a resonant tunneling structure layer including at least three tunnel barrier layers, and a first electrical contact layer and a second electrical contact layer each having a carrier.

The first electrical contact layer, the resonant tunneling structure layer and the second electrical contact layer are arranged in this order.

The resonant tunneling structure layer includes a first sub-band, a second sub-band, and a third sub-band which respectively have energies $E_1$, $E_2$, and $E_3$ relative to the carrier.

The resonant tunneling structure is such that where band edge energies of the first and second electrical contact layers relative to the carrier are expressed by $E_{b1}$ and $E_{b2}$, respectively; when no electric field is applied to the resonant tunneling structure, $(E_{b1}, E_{b2}) < E_1 < E_2 < E_3$ is satisfied; when a first electric field is applied to the resonant tunneling structure, a resonant tunneling phenomenon is caused by the third sub-band and the second sub-band; and when a second electric field different in polarity from the first electric field is applied to the resonant tunneling structure, a resonant tunneling phenomenon is caused by the second sub-band and the first sub-band.

A resonant tunneling structure according to the present invention comprises; a resonant tunneling structure layer including at least three tunnel barrier layers, and a first electrical contact layer and a second electrical contact layer each having a carrier.

The first electrical contact layer, the resonant tunneling structure layer and the second electrical contact layer are arranged in this order.

The resonant tunneling structure layer includes a first sub-band, a second sub-band, and a third sub-band which respectively have energies $E_1$, $E_2$, and $E_3$ relative to the carrier.

The resonant tunneling structure is such that where band edge energies of the first and second electrical contact layers relative to the carrier are expressed by $E_{b1}$ and $E_{b2}$, respectively; when no electric field is applied to the resonant tunneling structure, $(E_{b1}, E_{b2}) < E_1 < E_2 < E_3$ is satisfied; when a first electric field is applied to the resonant tunneling structure, a resonant tunneling phenomenon is caused by the third sub-band and the second sub-band; and when a second electric field different in polarity from the first electric field is applied to the resonant tunneling structure, a resonant tunneling phenomenon is caused by the second sub-band and the first sub-band.

Each of the first electrical contact layer and the second electrical contact layer is of an n-type semiconductor.

The resonant tunneling structure layer includes; a first tunnel barrier layer, a second tunnel barrier layer, a third tunnel barrier layer, a first quantum well layer interposed between the first tunnel barrier layer and the second tunnel barrier layer, and a second quantum well layer interposed between the second tunnel barrier layer and the third tunnel barrier layer.

The first quantum well layer includes at least the second sub-band.

The second quantum well layer includes at least the first sub-band and the third sub-band.

The first quantum well layer is different in thickness from the second quantum well layer.

When no electric field is applied to the resonant tunneling structure, band edge energies of either one of the first tunnel barrier layer and the third tunnel barrier layer relative to the carrier is larger than band edge energies of the second tunnel barrier layer relative to the carrier.

According to the present invention described above, it is possible to provide the resonant tunneling structure capable of generating oscillation of multiple fundamental oscillation frequencies when the first electric field is applied and when the second electric field different in polarity from the first electric field is applied.

Further features of the present invention will become apparent from the following description of an exemplary embodiment with reference to the attached drawings.

BRIEF DESCRIPTION OF THE DRAWINGS

FIGS. 2A and 2B are schematic explanatory diagrams illustrating structure of a resonant tunneling diode (RTD) including a resonant tunneling structure according to Example 1.

FIG. 5 is a graph illustrating current-voltage characteristics obtained using the RTD according to Example 1.

DESCRIPTION OF THE EMBODIMENT

A resonant tunneling structure according to an embodiment of the present invention includes the following constituent elements.

(a) A resonant tunneling structure layer having at least three tunnel barrier layers.

(b) A first electrical contact layer and a second electrical contact layer each having a carrier.

(c) The first electrical contact layer, the resonant tunneling structure and the second electrical contact layer are arranged in this order.

(d) The resonant tunneling structure layer includes a first sub-band, a second sub-band, and a third sub-band which respectively have energies $E_1$, $E_2$, and $E_3$ relative to the carrier.

(e) Where band edge energies of the first and second electrical contact layers relative to the carrier are expressed by $E_{b1}$ and $E_{b2}$, respectively, the resonant tunneling structure satisfies "$(E_{b1}, E_{b2}) < E_1 < E_2 < E_3$" when no electric field is applied to the resonant tunneling structure.

(f) The resonant tunneling phenomenon is caused by the third sub-band and the second sub-band when a first electric field is applied to the resonant tunneling structure.

(g) The resonant tunneling phenomenon is caused by the second sub-band and the first sub-band when a second electric field different in polarity from the first electric field is applied to the resonant tunneling structure.

(Three Tunnel Barrier Layers: Carrier is Electron)

Figure 1A:
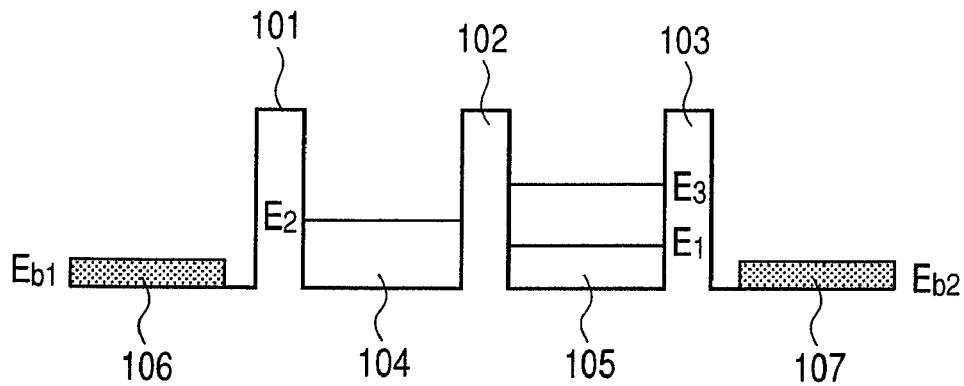
FIGS. 1A, 1B and 1C are schematic explanatory views illustrating energy band structures of conduction bands of a resonant tunneling structure according to an embodiment of the present invention.
Figure 1B:
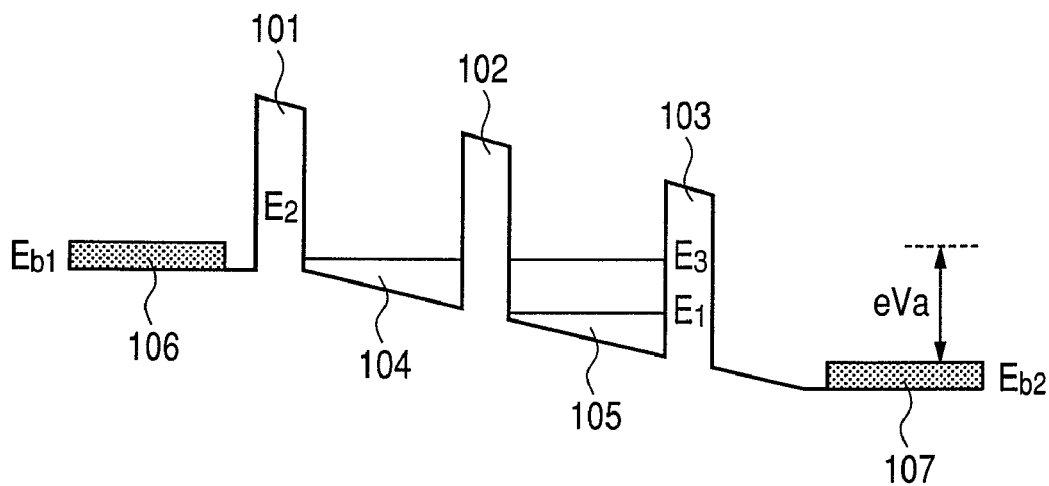
Figure 1C:
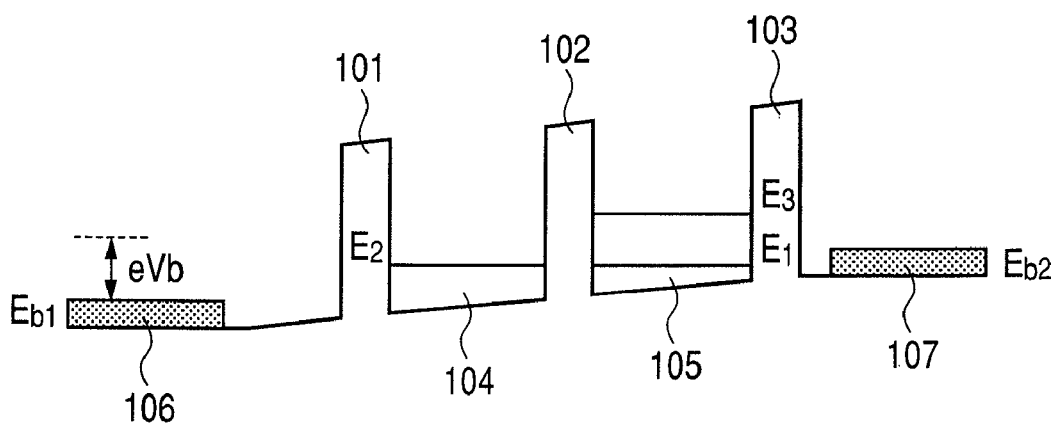

The resonant tunneling structure according to the embodiment of the present invention will be described with reference to FIGS. 1A to 1C. FIGS. 1A to 1C illustrate energy band structures of conduction bands of the resonant tunneling structure according to this embodiment.

The resonant tunneling structure with the energy band structures as illustrated in FIGS. 1A to 1C is assumed to include a resonant tunneling structure layer having three tunnel barrier layers. When the resonant tunneling structure has at least three sub-bands of this relationship, the number of tunnel barrier layers in the present invention is not limited to this. The minimum number of necessary tunnel barrier layers is three.

For example, there is a case where two adjacent quantum wells have three sub-bands (band structure of FIG. 1A) and a tunnel barrier layer is located adjacent to a first tunnel barrier layer 101 or a third tunnel barrier layer 103.

In the resonant tunneling structure having the energy band structures as illustrated in FIGS. 1A to 1C, a case where a carrier is an electron is assumed. The carrier in the present invention is not limited to this and thus may be a hole. When the carrier is the hole, the resonant tunneling structure can be described with reference to energy band structures of a valence band thereof.

The resonant tunneling structure layer in this embodiment includes the first tunnel barrier layer 101, a second tunnel barrier layer 102, and the third tunnel barrier layer 103. The resonant tunneling structure layer further includes a first quantum well layer 104 interposed between the first tunnel barrier layer 101 and the second tunnel barrier layer 102 and a second quantum well layer 105 interposed between the second tunnel barrier layer 102 and the third tunnel barrier layer 103.

The resonant tunneling structure according to this embodiment further includes a first electrical contact layer 106 and a second electrical contact layer 107 each having a carrier. In the resonant tunneling structure, the first electrical contact layer, the resonant tunneling structure layer, and the second electrical contact layer are arranged in this order.

The resonant tunneling structure according to this embodiment includes at least three sub-bands, that is, a first sub-band, a second sub-band, and a third sub-band, which respectively have energies $E_1$, $E_2$, and $E_3$ relative to the carrier.

The first quantum well layer 104 in this embodiment includes at least the second sub-band. The second quantum well layer 105 in this embodiment includes at least the first sub-band and the third sub-band.

Now, band edge energies of the first electrical contact layer 106 and the second electrical contact layer 107 relative to the carrier are expressed by $E_{b1}$ and $E_{b2}$, respectively.

Then, the resonant tunneling structure according to this embodiment satisfies "$(E_{b1}, E_{b2})<E_1<E_2<E_3$" when no electric field is applied thereto.

The resonant tunneling structure according to this embodiment is such that the resonant tunneling phenomenon is caused by the third sub-band and the second sub-band when a first electric field $V_a$ is applied to the resonant tunneling structure.

The resonant tunneling structure according to this embodiment is such that the resonant tunneling phenomenon is caused by the second sub-band and the first sub-band when a second electric field $V_b$ different in polarity from the first electric field is applied to the resonant tunneling structure.

The first electrical contact layer and the second electrical contact layer have the carrier such that the resonant tunneling phenomenon is caused by the third sub-band and the second sub-band when the first electric field is applied and the resonant tunneling phenomenon is caused by the second sub-band and the first sub-band when the second electric field is applied.

The resonant tunneling phenomenon may be caused when the energies of the sub-bands which are confined to different quantum well layers are substantially equal to each other (anti-crossing). In particular, when such a phenomenon occurs between the band edge energy of the layer for supplying the carrier and the vicinity of the Fermi energy, a large resonant current flows.

When electrons transit from a high-energy side of a sub-band to a low-energy side thereof in the resonant tunneling phenomenon, electromagnetic waves are emitted (photon-assisted tunneling), and hence a negative resistance appears in a current-voltage graph.

It is sufficient that the first, second and third sub-bands are located in the quantum well layers of the resonant tunneling structure such that the energies thereof satisfy "$(E_{b1}, E_{b2})<E_1<E_2<E_3$" and the resonant tunneling phenomenon occurs. In an example of the resonant tunneling structure including the three tunnel barrier layers, the second quantum well layer 105 may have the second sub-band and the first quantum well layer 104 may have the first and third sub-bands.

(Asymmetry with Respect to Second Quantum Well Layer)

The resonant tunneling structure according to this embodiment includes the following desirable structure.

The first quantum well layer is different in thickness from the second quantum well layer. Therefore, the relationship of "$(E_{b1}, E_{b2})<E_1<E_2<E_3$" can be easily obtained.

The present invention is not limited to the structure in which the first quantum well layer is different in thickness from the second quantum well layer. Therefore, a structure satisfying the relationship of "$(E_{b1}, E_{b2})<E_1<E_2<E_3$" can be employed.

In addition to the structures described above, a structure in which the first quantum well layer is different in material from the second quantum well layer can be employed. For example, a band edge of the material of the first quantum well layer and a band edge of the material of the second quantum well layer can be offset to obtain the relationship of "$E_1<E_2<E_3$". In this case, unless the offset is controlled so as to satisfy "$(E_{b1}, E_{b2})<E_1$", a resonant tunneling effect resulting from the first sub-band and the second sub-band cannot be obtained.

(Different Heights of Tunnel Barrier Layers)

The resonant tunneling structure according to this embodiment includes the following desirable structure.

It is so structured that the band edge energy of either one of the first and third tunnel barrier layers relative to the carrier is larger than the band edge energy of the second tunnel barrier layer relative to the carrier when no electric field is applied to the resonant tunneling structure. Therefore, the peak-to-valley ratio can be increased in a resonant tunneling effect resulting from the second sub-band and the third sub-band. In a typical case, an electric field strength for obtaining the resonant tunneling effect by the third sub-band and the second sub-band is larger than an electric field strength for obtaining the resonant tunneling effect by the second sub-band and the first sub-band.

The present invention is not limited to the structures described above.

(Electrical Contact Layer Made of N-type Semiconductor)

The resonant tunneling structure according to this embodiment includes the following desirable structure.

Each of the first electrical contact layer and the second electrical contact layer is made of an n-type semiconductor. Therefore, electrons can be selected as a carrier. It is known that the electron has a relatively higher mobility than holes.

The present invention is not limited to the structure described above.

The sub-band whose energy relative to the carrier is $E_1$ can be stated to be a sub-band whose energy level is $E_1$. The same applies to each of the case of $E_2$ and the case of $E_3$.

Hereinafter, the present invention will be described with reference to examples.

EXAMPLE 1

Resonant Tunneling Diode

Example 1 will be described with reference to FIGS. 2A, 2B, 3A, 3B, 3C, 4A, 4B, and 5.

FIGS. 2A and 2B are schematic explanatory diagrams illustrating a resonant tunneling diode (RTD) including a triple-barrier resonant tunneling structure according to this example.

Figure 3A:
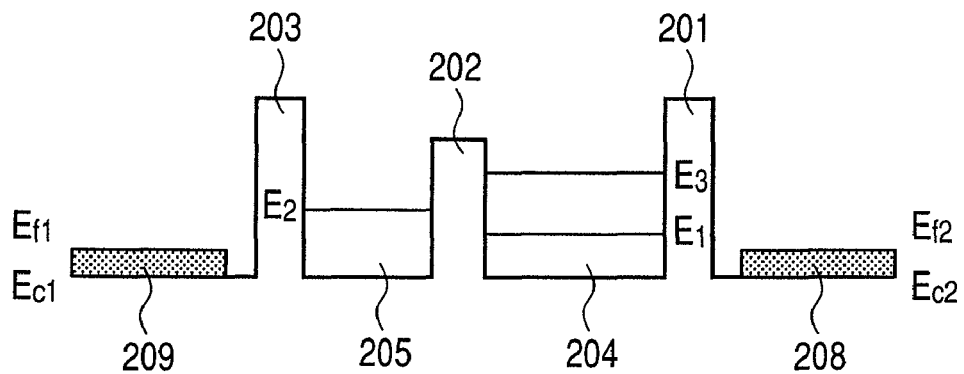
FIGS. 3A, 3B and 3C are schematic explanatory views illustrating energy band structures of conduction bands of the resonant tunneling structure according to Example 1.
Figure 3B:
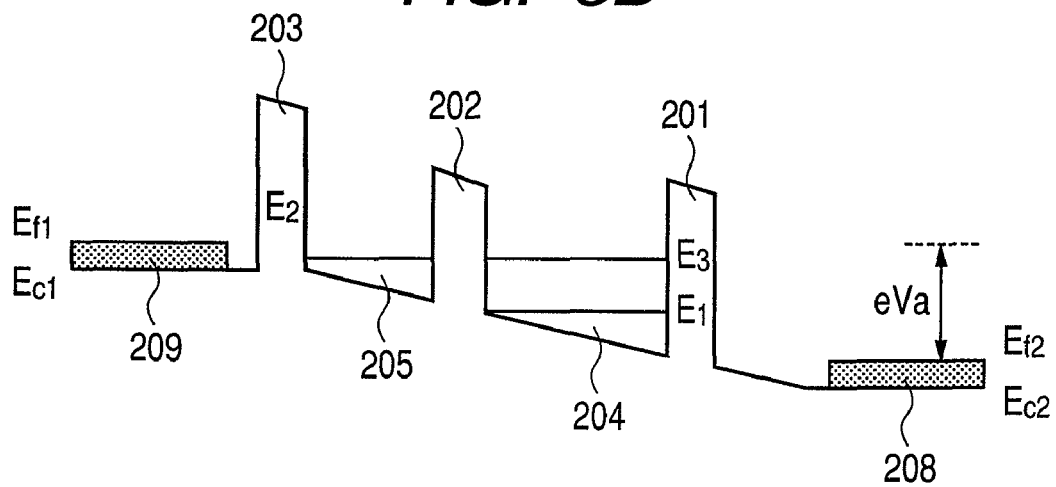
Figure 3C:
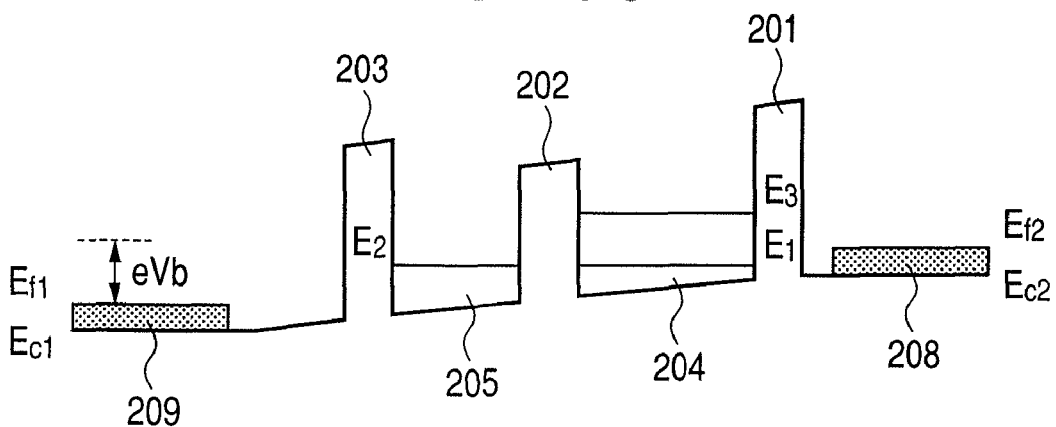

FIGS. 3A to 3C are schematic explanatory views illustrating energy band structures of conduction bands of the triple-barrier resonant tunneling structure according to this example.

Figure 4A:
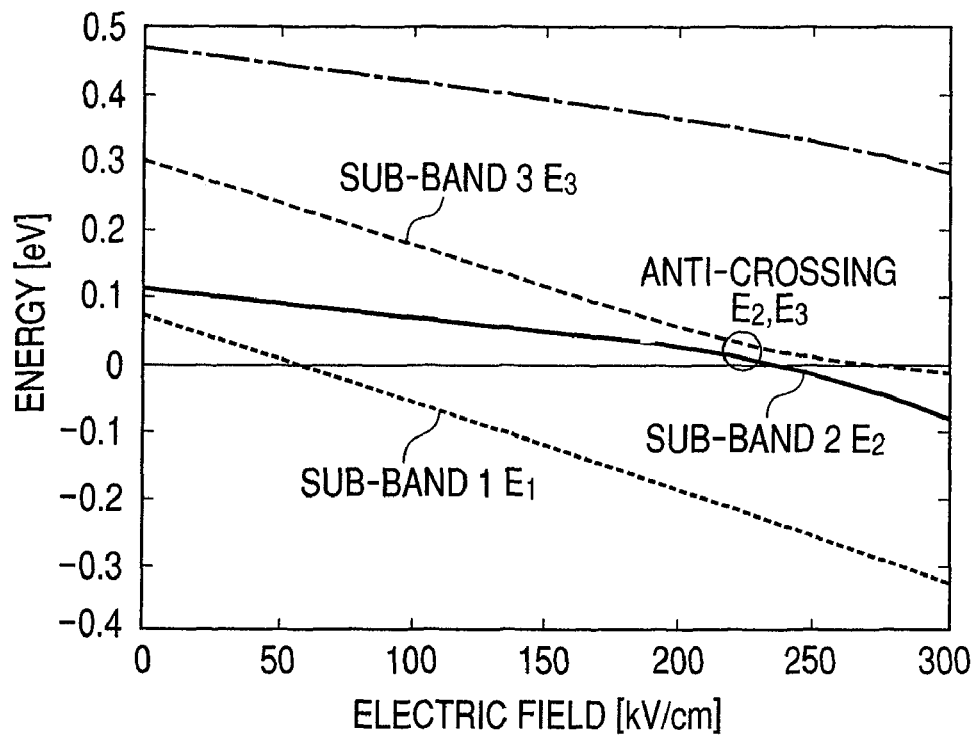
FIGS. 4A and 4B are graphs illustrating electric field dependence of sub-bands in the conduction bands of the resonant tunneling structure according to Example 1.
Figure 4B:
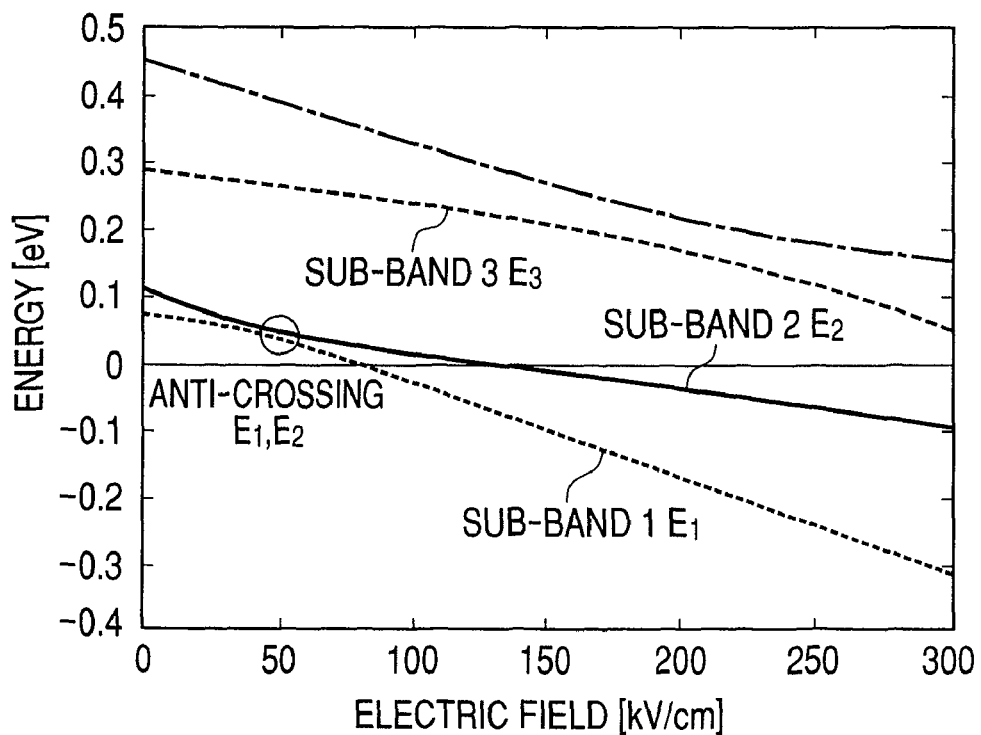

FIGS. 4A and 4B are graphs illustrating the electric field dependence of sub-bands of electrons.

FIG. 5 is a graph illustrating current-voltage characteristics of the resonant tunneling diode in the present invention, which are obtained by experiments.

A resonant tunneling diode (RTD) 200 according to this example will be described in detail with reference to FIG. 2A.

The RTD 200 includes a resonant tunneling structure layer 220. The resonant tunneling structure layer 220 includes a first tunnel barrier layer 201, a first quantum well layer 204, a second tunnel barrier layer 202, a second quantum well layer 205, and a third tunnel barrier layer 203, which are laminated in this order. The first tunnel barrier layer 201 is made of non-doped AlAs. The first quantum well layer 204 is made of non-doped InGaAs. The second tunnel barrier layer 202 is made of non-doped InAlAs. The second quantum well layer 205 is made of non-doped InGaAs. The third tunnel barrier layer 203 is made of non-doped AlAs.

The RTD 200 further includes a first contact layer 210 and a second contact layer 211, each of which is made of $n^{++}$InGaAs. The RTD 200 further includes a first electrical contact layer 208 and a second electrical contact layer 209, each of which is made of $n^+$InGaAs. The RTD 200 further includes a first spacer layer 206 and a second spacer layer 207, each of which is made of non-doped InGaAs. The layers 210, 208, 206, 211, 209, 207 are used as an electrode pair for applying a first electric field and a second electric field different in polarity from the first electric field. Thus, electric fields can be applied to the resonant tunneling structure layer 220. For example, the first electric field is applied by a positive bias voltage and the second electric field is applied by a negative bias voltage.

Each of the first and second contact layers 210 and 211 is a semiconductor layer doped to be a high concentration. The first and second contact layers 210 and 211 are connected with a voltage source 214 through ohmic electrodes 212 and 213, each of which is made of Ti/Pd/Au to supply a bias voltage to the RTD 200.

Each of the first electrical contact layer 208 and the second electrical contact layer 209 is a doped semiconductor layer which is a layer for supplying and receiving electrons to and from the resonant tunneling structure layer 220. The first electrical contact layer 208 and the second electrical contact layer 209 serve as emitters and collectors in accordance with an application direction of the bias voltage.

The first spacer layer 206 and the second spacer layer 207 are provided to prevent the first tunnel barrier layer 201 and the third tunnel barrier layer 203 from being degraded by diffusion of dopants when the resonant tunneling structure layer 220 is epitaxially grown.

The resonant tunneling structure layer 220 is made of a semiconductor crystal epitaxially grown on an InP substrate. Each of the first quantum well layer 204, the second quantum well layer 205, and the second tunnel barrier layer 202 is made of InGaAs/InAlAs in lattice-matched to the InP substrate. Each of the first tunnel barrier layer 201 and the third tunnel barrier layer 203 is made of AlAs which is not in lattice-matched to the InP substrate. Each of the first tunnel barrier layer 201 and the third tunnel barrier layer 203 is thinner than the critical thickness, and thus becomes a higher-energy barrier.

FIG. 2B illustrates the materials, film thicknesses, and dopant concentrations, which are used for the RTD 200 according to this example.

The first quantum well layer 204 and the second quantum well layer 205 of the resonant tunneling structure layer 220 are laminated at different film thicknesses.

Therefore, as illustrated in FIG. 3A, the energy level relationship among the second sub-band ($E_2$) belonging to the second quantum well layer 205 and the first and third sub-bands ($E_1$ and $E_3$) belonging to the first quantum well layer 204 when no electric field is applied becomes $E_1 < E_2 < E_3$.

The first tunnel barrier layer 201 is different in composition or thickness from the second tunnel barrier layer 202. Alternatively, the second tunnel barrier layer 202 is different in composition or thickness from the third tunnel barrier layer 203.

The first electrical contact layer 208 and the second electrical contact layer 209 are doped to be a high concentration. This enables injecting electrons from the electrical contact layer serving as the emitter side to the resonant tunneling structure layer 220 when each of the positive bias voltage and the negative bias voltage is applied. Therefore, when each of the positive bias voltage and the negative bias voltage is applied, the resonant tunneling phenomenon in the resonant tunneling structure layer 220 can be caused between the third sub-band ($E_3$) and the second sub-band ($E_2$), and between the second sub-band ($E_2$) and the first sub-band ($E_1$).

The thickness of the first quantum well layer 204 and the thickness of the second quantum well layer 205 are adjusted so as to cause the resonant tunneling phenomenon.

Next, the case of FIG. 3B will be described. This is the case where the positive bias voltage $V_a$ is applied to the resonant tunneling structure layer 220. The second electrical contact layer 209 serves as the emitter, and hence the second sub-band ($E_2$) of the second quantum well layer 205 and the third sub-band ($E_3$) of the first quantum well layer 204 resonate with each other. Note that $E_{F1}$ denotes a Fermi level of the second electrical contact layer 209 and $E_{C1}$ denotes a conduction band bottom energy of the second electrical contact layer 209.

In this case, when the energy level of the second sub-band ($E_2$) and the energy level of the third sub-band ($E_3$) are larger than the conduction band bottom energy $E_{C1}$ and smaller than the electron energy $E_{F1} \pm K_B T$ including thermal dispersion in the emitter, electrons are injected into the resonant tunneling structure layer 220.

In order to satisfy relationships "$E_{C1} < E_2$" and "$E_3 < E_{F1} \pm K_B T$" when the positive bias voltage $V_a$ is applied, the second electrical contact layer 209 is doped to be a sufficient concentration. In order to satisfy the relationships described above, the first quantum well layer 204, the second quantum well layer 205, the first tunnel barrier layer 201, the second tunnel barrier layer 202, and the third tunnel barrier layer 203 are adjusted in thickness and composition.

The electron energy $E_{F1} \pm K_B T$ including the thermal dispersion relative to the conduction band bottom energy $E_{C1}$ in the emitter is expressed as the near Fermi level. Note that $K_B$ denotes the Boltzmann's constant (J/K) and T denotes an absolute temperature (K).

In this example, an $n^+$InGaAs layer doped with Si at a concentration of $2 \times 10^{18}$ cm$^{-3}$ is used as the second electrical contact layer 209, and hence the energy of the Fermi level $E_{F1}$ relative to the conduction band bottom energy $E_{C1}$ is set to approximately 140 meV. The thermal dispersion $K_B T$ of electrons at room temperature is approximately 27 meV. Therefore, the electrons in the second electrical contact layer 209 are widely distributed in energy level, thereby securing a channel.

As illustrated in FIG. 4A, in the resonant tunneling structure layer 220 having the film thicknesses and the compositions which are illustrated in FIG. 2B, the second sub-band ($E_2$) and the third sub-band ($E_3$) resonate with each other (anti-crossing). When the positive bias voltage $V_a$ is approximately 0.7 V, that is, when the electric field strength is approximately 220 kV/cm, the second sub-band ($E_2$) and the third sub-band ($E_3$) resonate with each other at an energy of approximately 16 meV relative to the conduction band bottom energy $E_{C1}$.

In this case, the relationships "$E_{C1}<E_2$" and "$E_3<E_{F1}\pm K_BT$" are sufficiently satisfied, and hence electrons are injected from the first electrical contact layer 208 into the resonant tunneling structure layer 220.

Next, the case of FIG. 3C will be described. This is the case where the negative bias voltage $V_b$ which has a different polarity is applied to the resonant tunneling structure layer 220. The first electrical contact layer 208 serves as the emitter, and hence the second sub-band ($E_2$) of the second quantum well layer 205 and the first sub-band ($E_1$) of the first quantum well layer 204 resonate with each other.

In this case, when the energy level of the second sub-band ($E_2$) and the energy level of the first sub-band ($E_1$) each are larger than the conduction band bottom energy $E_{C2}$ and smaller than the electron energy $E_{F2}\pm K_BT$ in the emitter, electrons are injected into the resonant tunneling structure layer 220.

In order to satisfy relationships "$E_{C2}<E_2$" and "$E_1<E_{F2}\pm K_BT$" when the negative bias voltage $V_b$ is applied, the first electrical contact layer 208 is doped to be a sufficient concentration. In order to satisfy the relationships described above, the first quantum well layer 204, the second quantum well layer 205, the first tunnel barrier layer 201, the second tunnel barrier layer 202, and the third tunnel barrier layer 203 are adjusted in thickness and composition. Note that $E_{F2}$ denotes a Fermi level of the first electrical contact layer 208 and $E_{C2}$ denotes a conduction band bottom energy of the first electrical contact layer 208. In this example, an n$^+$InGaAs layer doped with Si at a concentration of $2\times10^{18}$ cm$^{-3}$ is used as the first electrical contact layer 208, and hence the energy of the Fermi level $E_{F2}$ relative to the conduction band bottom energy $E_{C2}$ is set to approximately 140 meV.

As illustrated in FIG. 4B, in the resonant tunneling structure layer 220 having the film thicknesses and the compositions which are illustrated in FIG. 2B, the second sub-band ($E_2$) and the first sub-band ($E_1$) resonate with each other (anti-crossing). When the negative bias voltage $V_b$ is approximately −0.2 V, that is, when the electric field strength is approximately 45 kV/cm, the second sub-band ($E_2$) and the first sub-band ($E_1$) resonate with each other at an energy level of approximately 50 meV relative to the conduction band bottom energy $E_{C2}$. In this case, the relationships "$E_{C2}<E_2$" and "$E_1<E_{F2}\pm K_BT$" are sufficiently satisfied, and hence electrons are injected from the first electrical contact layer 208 into the resonant tunneling structure layer 220.

FIG. 5 is a graph obtained by measuring current-voltage characteristics of the RTD 200 according to this example. When two kinds of bias voltages which are different in polarity from each other are applied to the RTD 200, two negative differential resistance regions which are different in peak current density and peak-to-valley ratio from each other are observed.

For example, when the positive bias voltage is applied, the peak current density $J_p$ is equal to 280 kA/cm$^2$. When the RTD has a mesa structure with a diameter of approximately 2 μm Φ, a negative differential resistance (hereinafter, referred to as NDR) is −22Ω. When the negative bias voltage is applied, the peak current density $J_p$ is equal to 90 kA/cm$^2$. When the RTD has a mesa structure with a diameter of approximately 2 μm Φ, the NDR is −174 Ω.

As described above, according to the resonant tunneling diode having the resonant tunneling structure in the present invention, when two or more different kinds of negative differential resistances are obtained by a single RTD based on the polarity of the applied bias voltage and the level thereof.

In this example, the triple-barrier resonant tunneling diode of InGaAs/InAlAs and InGaAs/AlAs which are grown on the InP substrate has been described. However, the present invention is not limited to these materials. Even when other materials are combined, the resonant tunneling diode according to the present invention can be provided. For example, GaAs/AlGaAs, GaAs/AlAs, and InGaAs/GaAs/AlAs may be formed on the GaAs substrate. In addition, InGaAs/AlGaAsSb may be formed on the InP substrate. Further, InAs/AlAsSb and InAs/AlSb may be formed on the InAs substrate, or SiGe/SiGe may be formed on an Si substrate.

The case where the carrier is assumed to be the electron has been described. Even when a hole is used as the carrier, a resonant tunneling diode having the same operating principle in the valence band can be provided. The energy band structures illustrated in FIGS. 3A to 3C relate to the conduction band and the carrier is the electron. However, when the ordinate indicating the energy is reversed to be provided for the valence band, energy band structures in which the carrier is the hole are obtained.

The resonant tunneling diode including the three tunnel barrier layers has been described. It is possible to provide a resonant tunneling diode which includes four or more tunnel barrier layers and has the same operating principle. For example, when the second tunnel barrier layer is divided into two tunnel barrier layers by design in the case of FIGS. 3A to 3C, the sub-bands having the electric field dependence as illustrated in FIGS. 4A and 4B can be obtained.

Japanese Patent Publication No. H06-030399 does not describe that the same device is subjected to reverse bias application. Japanese Patent Publication No. H06-030399 does not actively discuss a resonant tunneling structure in which a resonant tunneling phenomenon occurs even when the reverse bias is applied. The resonant tunneling structure illustrated in FIGS. 9A and 9B in Japanese Patent Publication No. H06-030399 satisfies "($E_{b1}, E_{b2})>E_1$" when no electric field is applied. Note that $E_1$ denotes the energy of the first sub-band relative to the carrier, and $E_{b1}$ and $E_{b2}$ denote the band edge energy of the first electrical contact layer relative to the carrier and the band edge energy of the second electrical contact layer relative to the carrier, respectively. Even when the first electric field or the second electric field is applied to the resonant tunneling structure, the resonant tunneling phenomenon does not occur.

EXAMPLE 2

Electromagnetic Wave Oscillator

Example 2 will be described with reference to FIGS. 6 and 7. This example relates to an electromagnetic wave oscillator including an active layer and an electromagnetic wave resonator. The active layer has the resonant tunneling structure.

For example, the electromagnetic wave oscillator includes the active layer having the resonant tunneling diode (RTD) according to Example 1 and the electromagnetic wave resonator.

Figure 6:
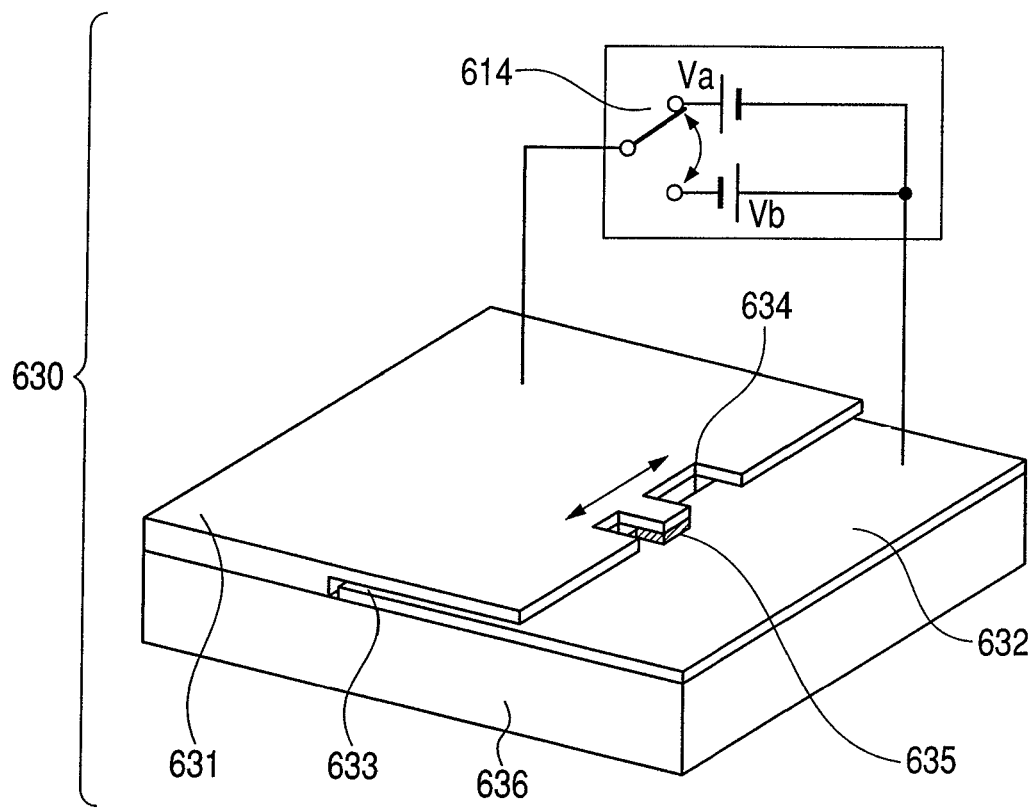
FIG. 6 is a schematic explanatory diagram illustrating structure of an electromagnetic wave oscillator according to Example 2.

FIG. 6 is a schematic explanatory diagram illustrating structure of the electromagnetic wave oscillator in which the RTD 200 according to Example 1 is incorporated as the active layer into the electromagnetic wave resonator.

Figure 7:
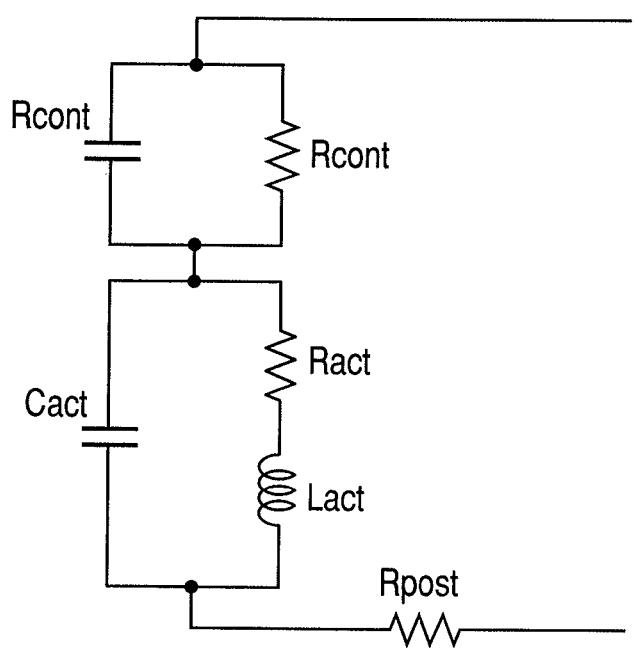
FIG. 7 is a schematic explanatory diagram illustrating an equivalent circuit of the electromagnetic wave oscillator according to Example 2.

FIG. 7 illustrates an equivalent circuit of the RTD according to Example 1.

An electromagnetic wave oscillator 630 has a slot antenna electromagnetic wave resonator structure. Ti/Pd/Au layers 631 and 632 serving as electrodes and an antenna are formed on an InP substrate 636. An SiO$_2$ insulating layer 633 is interposed between the Ti/Pd/Au layers 631 and 632. The electrode 631 has a window region 634 obtained by removing a portion of the electrode 631, thereby forming the slot antenna electromagnetic wave resonator structure. The length of the window region which is indicated by the double-headed arrow is a factor for determining the oscillation frequency. A mesa portion 635 corresponds to the RTD 200 formed into a post shape. The Ti/Pd/Au layers 631 and 632 correspond to the ohmic electrodes 212 and 213 illustrated in FIG. 2A and are connected with the voltage source 614. In this example, the window width of the slot antenna is set to 30 μm and the mesa portion 635 having each side length of 2.3 μm is provided.

A general resonant tunneling diode (RTD) is expressed by the equivalent circuit illustrated in FIG. 7 as disclosed in APL, Vol. 55 <17>, p. 1777 and p. 1989. The upper limit of an operating frequency of the resonant tunneling diode is determined based on the time constant of an RCL circuit. In the case of the electromagnetic wave oscillator, the fundamental oscillation frequency is determined based on the resonance frequency of an LC circuit of a resonance circuit in which the equivalent circuit illustrated in FIG. 7 is connected with a load resistor, a capacitor component, and an inductance component, which are determined from structure of the resonator.

In FIG. 7, $R_{cont}$ and $C_{cont}$ denote a contact resistance component and a contact capacitance component, respectively, between the electrode 631 and the contact layer 610, and $R_{post}$ denotes a resistance component which is connected in series with the RTD 200 and caused by the mesa structure. In addition, $R_{act}$ denotes the NDR (<0) of the RTD 200, $C_{act}$ denotes a capacitance component of the RTD 200, and $L_{act}$ denotes an inductance component of the RTD 200.

The inductance component $L_{act}$ expresses, as a delay inductance, an electron delay time τ in the RTD 200 which is obtained by taking into account an electron tunneling time in the RTD 200 and an electron transit time to a depletion layer. A relationship "$L_{act}=R_{act}\times\tau$" is known.

The electromagnetic wave oscillator 630 is fed with the bias voltages ($V_a$ and $V_b$) having different polarities from the voltage source 614, and hence the two kinds of negative differential resistances are obtained as illustrated in FIG. 5. Because the two kinds of negative differential resistances are obtained corresponding to the bias voltages $V_a$ and $V_b$, the delay inductance $L_{act}$ of the equivalent circuit illustrated in FIG. 7 changes. When the RTD 200 according to this example is used, the delay inductance $L_{act}$ changes by 790%. As a result, even when the same slot antenna resonator is used, the resonance frequency of the entire resonance circuit significantly changes, and hence such a change appears as a change in oscillation frequency. Therefore, according to the electromagnetic wave oscillator using the resonant tunneling diode having the structure described above in the present invention, the polarity of the applied bias voltage and the level thereof are changed based on the two or more different kinds of negative differential resistances. Thus, oscillation can be generated with the two or more kinds of fundamental oscillation frequencies. In this example, when the bias voltage $V_a$ is equal to 0.8 V, oscillation can be generated at 220 GHz. When the bias voltage $V_b$ with changed polarity is equal to −0.3 V, oscillation can be generated at 455 GHz.

In this example, the slot antenna structure is used for the resonator. A resonator may be used in which a microstrip line and a microstrip antenna (for example, patch antenna) which have an advantage to form an array and to obtain a high output are combined. Even when a cavity waveguide having a three-dimensional structure is employed in which a wall surface and rear surface of a device having a high Q value are covered with electrodes, the resonator can be provided.

When the oscillation frequency is to be actually adjusted, one may use a structure in which a switching element is provided for the voltage source 614 as illustrated in FIG. 6 to switch between the voltage signals ($V_a$ and $V_b$). To be specific, switching is performed between the positive bias voltage applied to generate an electromagnetic wave at a first fundamental oscillation frequency and the negative bias voltage applied to generate an electromagnetic wave at a second fundamental oscillation frequency. Therefore, the electromagnetic wave oscillation device including the electromagnetic wave oscillator according to this example and the switching element for switching between the voltage signals may be used.

In order to protect the device (oscillator), the device may be driven such that the voltage signal is gradually reduced to 0 and then the polarity is changed and the voltage is gradually increased. The resonant tunneling diode can generally operate fast. Therefore, the frequency may be quickly changed by switchings, and hence frequency shift keying (FSK) modulation may be performed for sub-THz band communication to drive the device as a light source.

A method of driving the electromagnetic wave oscillator according to this example is as follows. That is, a first electrical signal for inducing photon-assisted tunneling between the third sub-band and the second sub-band is applied to the resonant tunneling structure layer in the above-described Example. The first electrical signal is, for example, an electrical signal indicating the positive bias voltage to be applied. Therefore, the electromagnetic wave having the first fundamental oscillation frequency is generated. A second electrical signal different in polarity from the first electrical signal, for inducing photon-assisted tunneling between the second sub-band and the first sub-band, is applied to the resonant tunneling structure layer. The second electrical signal is, for example, an electrical signal indicating the negative bias voltage to be applied. Therefore, the electromagnetic wave having the second fundamental oscillation frequency is generated.

EXAMPLE 3

Inspection Apparatus

Example 3 will be described with reference to FIGS. 8 and 9.

This example relates to an object inspection apparatus using, for example, the electromagnetic wave oscillator including the resonant tunneling diode according to the above-described Example.

Figure 8:
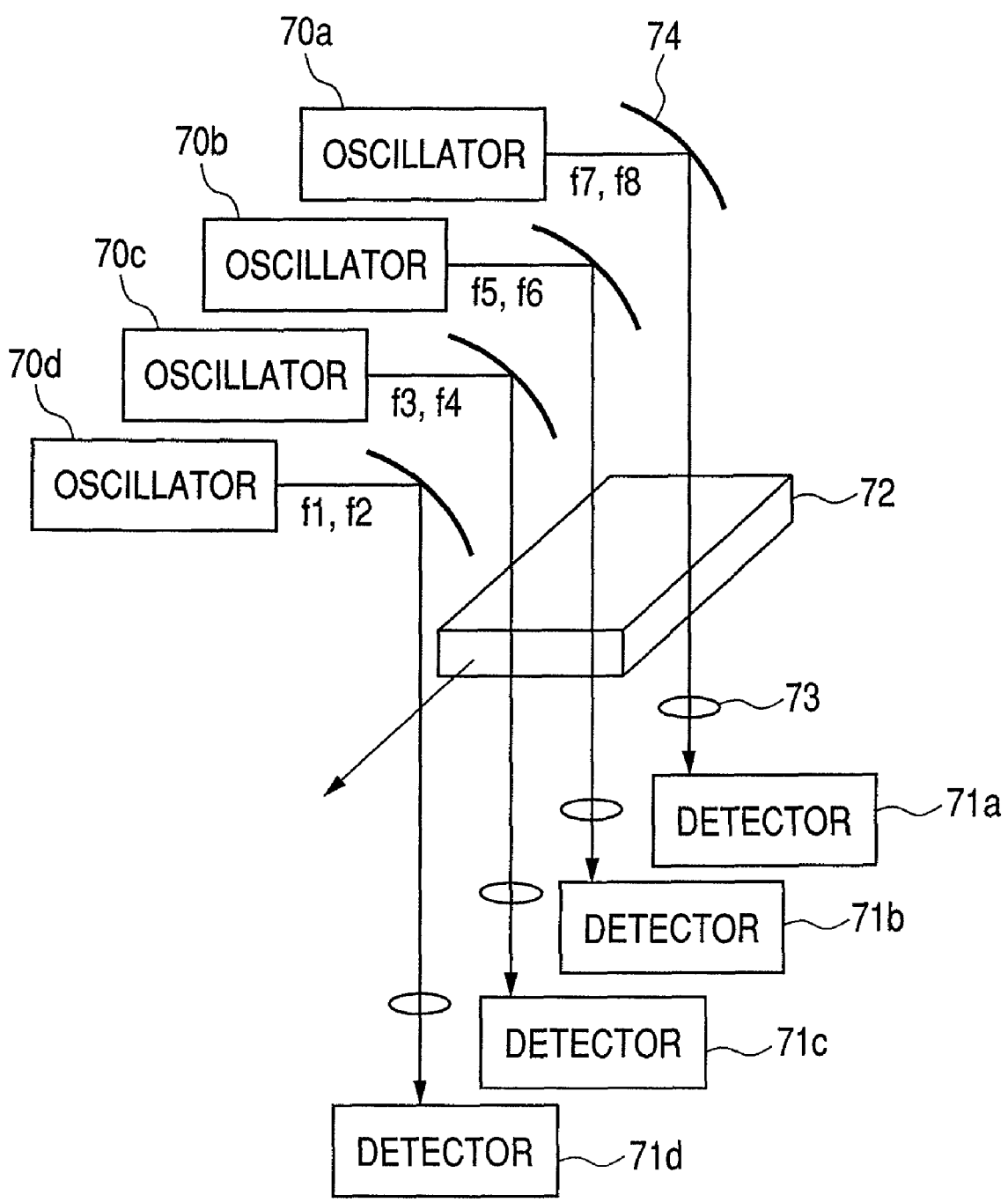
FIG. 8 is a schematic explanatory diagram illustrating an inspection apparatus according to Example 3.

As illustrated in FIG. 8, the inspection apparatus according to this example includes, for example, electromagnetic wave oscillators 70a to 70d oscillating at the two frequencies in the above-described Example, which are arranged to generate electromagnetic waves at multiple oscillation frequencies f1 to f8. The respective electromagnetic waves are propagated as parallel beams by a parabolic mirror 74 to irradiate a target object 72 which is an inspection object with the parallel beams. Transmitted beams are condensed by lenses 73 and received by detectors 71a to 71d. In this example, the transmission arrangement is employed. Reflection arrangement may also be employed for inspection.

For example, intensity combination patterns to be received by the detectors are pre-stored in a storage device. Assume that an inspection substance has a specific absorption spectrum of at least one of the oscillation frequencies f1 to f8. In this case, when the absorption spectrum of the inspection substance is compared with the stored patterns, whether or not the substance to be inspected is contained in the target object 72 can be determined.

Figure 9:
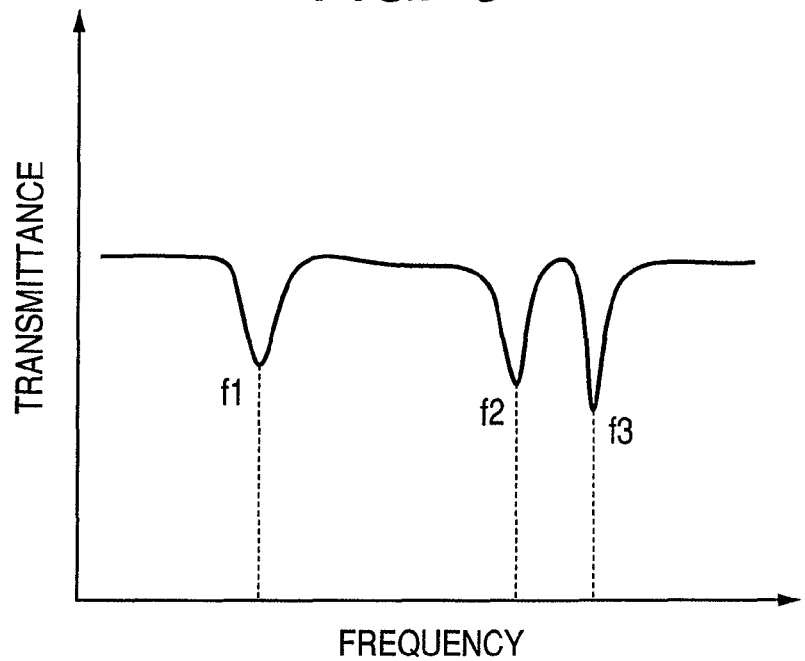
FIG. 9 is an explanatory graph illustrating a fingerprint spectrum in the inspection apparatus according to Example 3.
Figure 10:
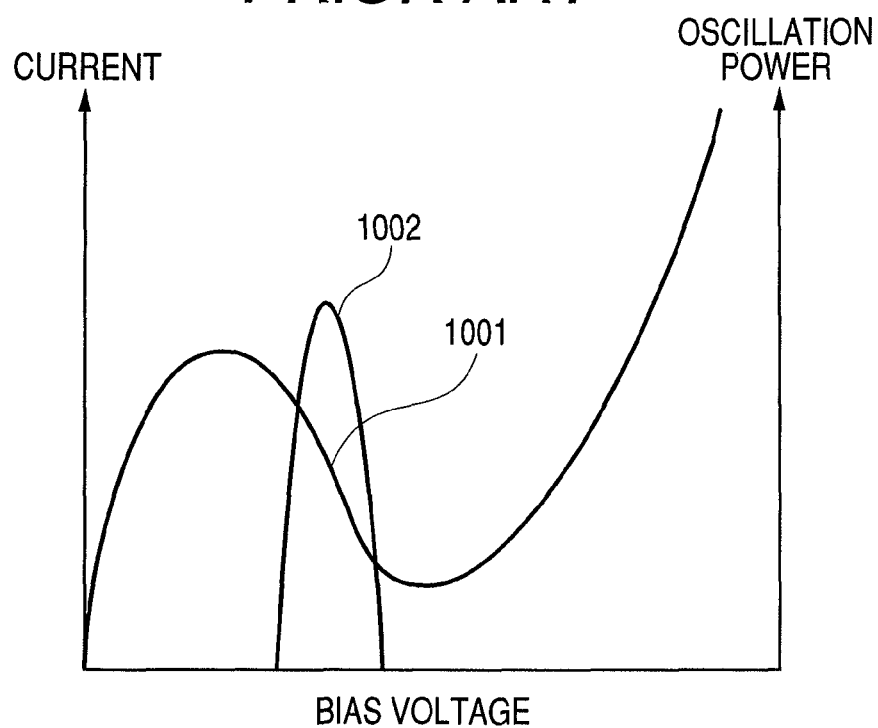
FIG. 10 is a schematic explanatory diagram illustrating a conventional technology.

FIG. 9 illustrates an example of a fingerprint spectrum of the inspection substance. Absorption peaks are observed at the oscillation frequencies f1, f2, and f3. Therefore, the absorption pattern of the inspection substance is stored in advance. Then, when obtaining the information that detector outputs are weak at the oscillation frequencies f1, f2, and f3 and detector outputs are large at the other oscillation frequencies, it can be determined that the inspection substance is contained.

The inspection apparatus according to this example can be utilized for, for example, the inspection of baggage in airports (to detect dangerous materials or prohibited substances), the inspection of distribution goods such as mails or freight, and the inspection of industrial products in factories.

EXAMPLE 4

Heterodyne Detector

Example 4 will be described with reference to FIGS. 11A and 11B.

In this example, a heterodyne detector using as a local oscillator the electromagnetic wave oscillator including the resonant tunneling diode (RTD) according to the above-described Example is provided.

Figure 11A:
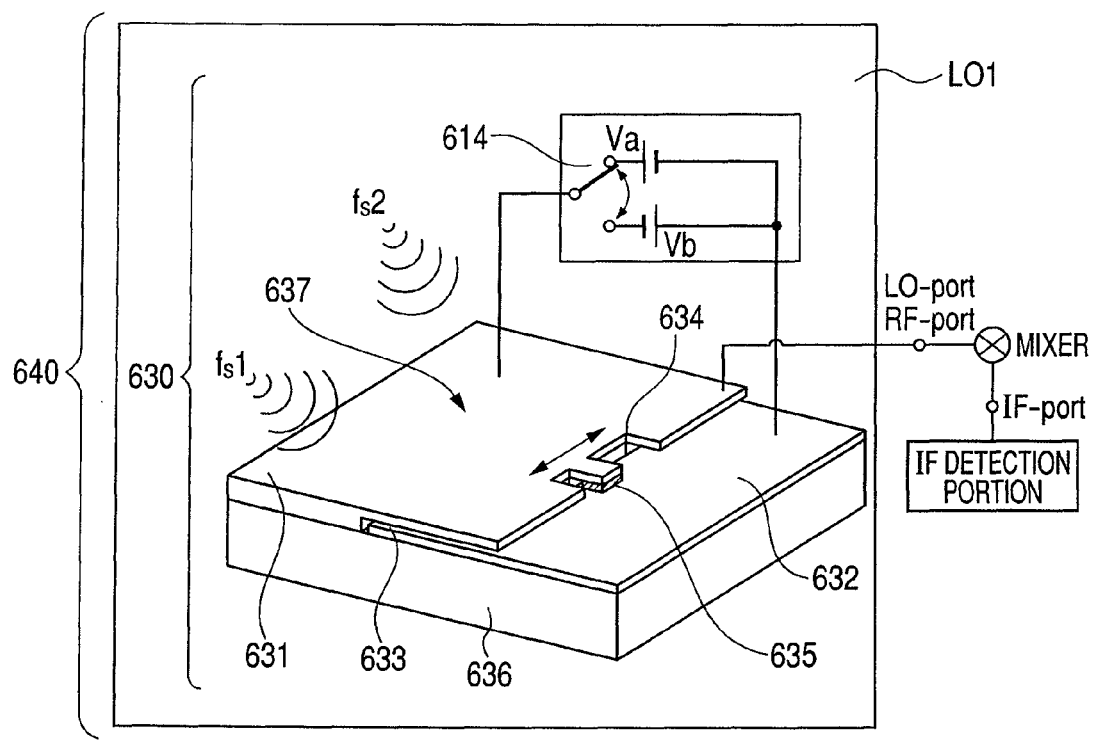
FIGS. 11A and 11B are schematic explanatory diagrams illustrating detectors according to Example 4.
Figure 11B:
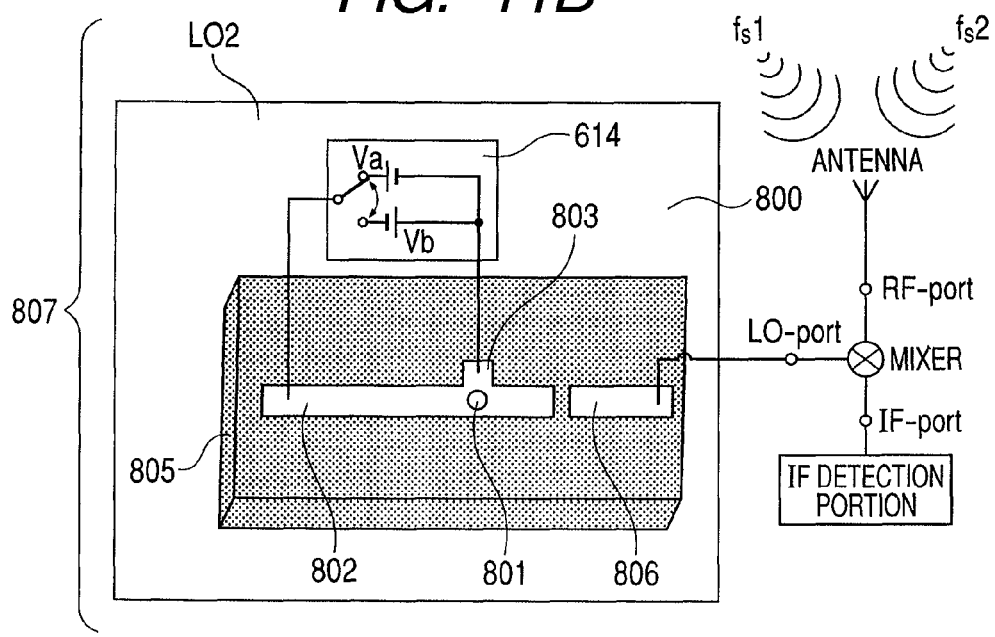

FIGS. 11A and 11B are schematic diagrams illustrating examples of the heterodyne detector according to this example. FIG. 11A illustrates an example in which a slot antenna electromagnetic wave oscillator is used as the local oscillator. FIG. 11B illustrates an example in which a microstrip electromagnetic wave oscillator is used as the local oscillator.

As illustrated in FIGS. 11A and 11B, each of the examples of the electromagnetic wave (heterodyne) detector according to this example includes a local oscillator (LO1 or LO2), a mixer (Mixer), an IF detection portion, an LO-port, an RF-port, and an IF-port. The detector illustrated in FIG. 11B further includes an antenna (Antenna).

The local oscillator (LO1 or LO2) is a locally generated wave oscillator for heterodyne detection. The electromagnetic wave oscillator according to the present invention is used as the local oscillator.

The mixer is a device for efficiently converting RF power into IF power. A Schottky diode, a superconducting SIS mixer, a hot electron bolometer, or an HBT/HEMT mixer is used as the mixer.

The IF detection portion acts to detect an intermediate frequency (IF) output generated by the mixer. The antenna (Antenna) acts to receive a signal to be detected. The LO-port acts as an input port for inputting a locally generated wave to the mixer (Mixer). The RF-port acts as an input port for inputting a signal wave to the mixer (Mixer). The IF-port acts as an input port for inputting the intermediate frequency (IF) output to the IF detection portion. Though not particularly shown, when a filter or an RF amplifier is provided between the antenna (Antenna) and the mixer (Mixer), between the antenna (Antenna) and the local oscillator (LO1 or LO2), or between the mixer (Mixer) and the local oscillator (LO1 or LO2), a higher-sensitivity electromagnetic wave detector is realized.

The detector according to the present invention will be described in detail with reference to FIG. 11A. A detector 640 includes the local oscillator LO1. The local oscillator LO1 includes the electromagnetic wave oscillator 630 having a slot antenna resonator structure 637 and the voltage source 614 having a voltage switching element. As is apparent from the description of Example 2, the local oscillator LO1 is fed with the bias voltages ($V_a$ and $V_b$) having the polarities different from each other to have the two fundamental oscillation frequencies (wavelengths). In this example, the two fundamental oscillation frequencies correspond to two locally generated waves ($f_L1$ and $f_L2$). The slot antenna resonator structure 637 of the detector 640 also acts as an antenna for receiving signal waves ($f_S1$ and $f_S2$). The received signal waves and the locally generated waves from the electromagnetic wave oscillator 630 are input to the mixer (Mixer) through the RF-port and the LO-port, and subjected to frequency-mixing to generate the intermediate frequency (IF) $f_{IF}$ which is a difference frequency component. The generated intermediate frequency (IF) $f_{IF}$ is detected by the IF detection portion through the IF-port.

An operation of the detector according to the present invention will be described. For example, when the bias voltage $V_a$ is applied from the voltage source 614 to the electromagnetic wave oscillator 630, the local oscillator (LO1) generates a locally generated wave 1 ($f_L1$). At this time, the detector 640 receives a signal wave 1 having the frequency $f_S1(=|f_L1+f_{IF}|)$ through the antenna. The intermediate frequency (IF) $f_{IF}$ output from the mixer (Mixer) is detected by the IF detection portion to detect the signal wave 1. When the bias voltage $V_b$ different in polarity from the bias voltage $V_a$ is applied from the voltage source 614 to the electromagnetic wave oscillator 630, the local oscillator (LO1) generates a locally generated wave 2 ($f_L2$). At this time, the detector 640 receives a signal wave 2 having the frequency $f_S2(=|f_L2+f_{IF}|)$ through the antenna. The intermediate frequency (IF) $f_{IF}$ output from the mixer (Mixer) is detected by the IF detection portion to detect the signal wave 2.

For example, when the electromagnetic wave oscillator described in Example 2 is used, the two kinds of frequencies of the locally generated waves are 455 GHz ($f_L1$) and 220 GHz ($f_L2$). When the intermediate frequency $f_{IF}$ is 2 GHz, two kinds of electromagnetic waves ($f_S1$=457 GHz and $f_S2$=222 GHz) are detected.

Even when the electromagnetic wave oscillator including the resonant tunneling diode according to the present invention and the microstrip resonator is used as the local oscillator as illustrated in FIG. 11B, the same detection can be performed. A detector 807 includes the local oscillator LO2. The local oscillator LO2 includes: an RTD 801; a microstrip line 802; a λ/4 stub 803; a locally generated wave output portion 806; a substrate 805; and the voltage source 614, and is manufactured by a general MMIC technology. Even in such structure, the signals ($f_S1$ and $f_S2$) received through the antenna (Antenna) can be heterodyne-detected using the two kinds of locally generated waves ($f_L1$ and $f_L2$) which are generated from the local oscillator LO2 in response to the bias voltages $V_a$ and $V_b$.

As described above, the oscillator using the resonant tunneling diode according to the present invention is used as the local oscillator for heterodyne mixing, and hence the detector capable of detecting (heterodyne-detecting) electromagnetic waves having at least two kinds of frequencies is realized.

According to the detector in this example, the electromagnetic waves having the multiple frequency bands can be detected by a single detector, and hence a reduction in size of the detector and an increase in detector density are easily achieved. When multiple detectors each being the detector according to this example are arranged in an array, a small-size detector capable of detecting the electromagnetic waves having the multiple frequencies at high sensitivity is realized.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2007-308969, filed Nov. 29, 2007 which is hereby incorporated by reference herein in its entirety.

What is claimed is:

1. A resonant tunneling structure, comprising:
a resonant tunneling structure layer including at least three tunnel barrier layers; and
a first electrical contact layer and a second electrical contact layer each having a carrier,
wherein the first electrical contact layer, the resonant tunneling structure layer and the second electrical contact layer are arranged in this order,
wherein the resonant tunneling structure layer includes a first sub-band, a second sub-band, and a third sub-band which respectively have energies $E_1$, $E_2$, and $E_3$ relative to the carrier, and
wherein the resonant tunneling structure is such that where band edge energies of the first and second electrical contact layers relative to the carrier are expressed by $E_{b1}$ and $E_{b2}$, respectively,
when no electric field is applied to the resonant tunneling structure, $(E_{b1}, E_{b2}) < E_1 < E_2 < E_3$ is satisfied;
when a first electric field is applied to the resonant tunneling structure, the third sub-band and the second sub-band resonate with each other between the energy $E_{b1}$ and a near Fermi level energy of the first electrical contact layer; and
when a second electric field different in polarity from the first electric field is applied to the resonant tunneling structure, the second sub-band and the first sub-band resonate with each other between the energy $E_{b2}$ and a near Fermi level energy of the second electrical contact layer.

2. A resonant tunneling structure according to claim 1,
wherein the resonant tunneling structure layer comprises:
a first tunnel barrier layer;
a second tunnel barrier layer;
a third tunnel barrier layer;
a first quantum well layer interposed between the first tunnel barrier layer and the second tunnel barrier layer; and
a second quantum well layer interposed between the second tunnel barrier layer and the third tunnel barrier layer,
wherein the first quantum well layer includes at least the second sub-band, and
wherein the second quantum well layer includes at least the first sub-band and the third sub-band.

3. A resonant tunneling structure according to claim 2, wherein the first quantum well layer is different in thickness from the second quantum well layer.

4. A resonant tunneling structure according to claim 2, wherein, when no electric field is applied to the resonant tunneling structure, band edge energies of either one of the first tunnel barrier layer and the third tunnel barrier layer relative to the carrier is larger than band edge energies of the second tunnel barrier layer relative to the carrier.

5. A resonant tunneling structure according to claim 1, wherein each of the first electrical contact layer and the second electrical contact layer is of an n-type semiconductor.

6. A resonant tunneling diode, comprising:
the resonant tunneling structure according to claim 1; and
an electrode pair for applying the first electric field and the second electric field.

7. An electromagnetic wave oscillator, comprising:
an active layer including the resonant tunneling structure according to claim 1; and
an electromagnetic wave resonator.

8. An electromagnetic wave oscillator, comprising:
an active layer comprised of the resonant tunneling diode according to claim 6; and
an electromagnetic wave resonator.

9. An electromagnetic wave oscillation device, comprising:
the electromagnetic wave oscillator according to claim 7; and
a switching element for conducting switching-over between the first electric field applied to generate an electromagnetic wave having a first fundamental oscillation frequency and the second electric field applied to generate an electromagnetic wave having a second fundamental oscillation frequency.

10. A method of driving the electromagnetic wave oscillator according to claim 7, comprising:
applying to the resonant tunneling structure layer a first electrical signal for inducing photon-assisted tunneling between the third sub-band and the second sub-band to generate an electromagnetic wave having a first fundamental oscillation frequency; and
applying to the resonant tunneling structure layer a second electrical signal for inducing photon-assisted tunneling between the second sub-band and the first sub-band to generate an electromagnetic wave having a second fundamental oscillation frequency, the second electrical signal being different in polarity from the first electrical signal.

11. An electromagnetic wave detector, comprising:
the electromagnetic wave oscillator according to claim 7; and
a mixer,
wherein the electromagnetic wave detector heterodyne-detects electromagnetic waves of at least two wavelengths.

12. An electromagnetic wave detector, comprising:
a local oscillator comprising the electromagnetic wave oscillation device according to claim 9; and
a mixer,
wherein the electromagnetic wave detector heterodyne-detects electromagnetic waves of at least two wavelengths.

13. A resonant tunneling structure, comprising:
a resonant tunneling structure layer including at least three tunnel barrier layers; and
a first electrical contact layer and a second electrical contact layer each having a carrier,
wherein the first electrical contact layer, the resonant tunneling structure layer and the second electrical contact layer are arranged in this order,
wherein the resonant tunneling structure layer includes a first sub-band, a second sub-band, and a third sub-band which respectively have energies $E_1$, $E_2$, and $E_3$ relative to the carrier,
wherein the resonant tunneling structure is such that where band edge energies of the first and second electrical contact layers relative to the carrier are expressed by $E_{b1}$ and $E_{b2}$, respectively:

when no electric field is applied to the resonant tunneling structure, $(E_{b1}, E_{b2}) < E_1 < E_2 < E_3$ is satisfied;

when a first electric field is applied to the resonant tunneling structure, a resonant tunneling phenomenon is caused by the third sub-band and the second sub-band; and when a second electric field different in polarity from the first electric field is applied to the resonant tunneling structure, a resonant tunneling phenomenon is caused by the second sub-band and the first sub-band, wherein each of the first electrical contact layer and the second electrical contact layer is of an n-type semiconductor, wherein the resonant tunneling structure layer includes:
- a first tunnel barrier layer;
- a second tunnel barrier layer;
- a third tunnel barrier layer;
- a first quantum well layer interposed between the first tunnel barrier layer and the second tunnel barrier layer; and
- a second quantum well layer interposed between the second tunnel barrier layer and the third tunnel barrier layer, wherein the first quantum well layer includes at least the second sub-band, wherein the second quantum well layer includes at least the first sub-band and the third sub-band, wherein the first quantum well layer is different in thickness from the second quantum well layer, and wherein, when no electric field is applied to the resonant tunneling structure, a band edge energy of either one of the first tunnel barrier layer and the third tunnel barrier layer relative to the carrier is larger than a band edge energy of the second tunnel barrier layer relative to the carrier.

14. A resonant tunneling structure according to claim 1, wherein when no electric field is applied to the resonant tunneling structure, $(E_{b1}, E_{b2}) < (E_{f1}, E_{f2}) < E_1 < E_2 < E_3$ is satisfied, wherein $E_{f1}$ and $E_{f2}$ are the near Fermi level energies of the first and the second electrical contact layers, respectively.

15. A resonant tunneling structure according to claim 1, wherein the first, second and third sub-bands are continuous sub-bands in the order of $E_1 < E_2 < E_3$.

* * * * *